United States Patent
Derras

(10) Patent No.: US 8,296,638 B2
(45) Date of Patent: Oct. 23, 2012

(54) VITERBI DETECTOR THAT ASSOCIATES MULTIPLE DATA DEPENDENT NOISE PREDICTION FILTERS WITH EACH POSSIBLE BIT PATTERN

(75) Inventor: Belkacem Derras, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 842 days.

(21) Appl. No.: 12/434,958

(22) Filed: May 4, 2009

(65) Prior Publication Data

US 2010/0281347 A1    Nov. 4, 2010

(51) Int. Cl.
*H03M 13/03* (2006.01)
(52) U.S. Cl. ........ 714/795; 714/794; 714/796; 375/341; 360/46; 370/242
(58) Field of Classification Search ........................ None
See application file for complete search history.

(56) References Cited

U.S. PATENT DOCUMENTS

| | | | | |
|---|---|---|---|---|
| 6,708,308 | B2 * | 3/2004 | De Souza et al. | 714/795 |
| 7,173,784 | B2 | 2/2007 | Cideciyan et al. | |
| 7,440,208 | B1 * | 10/2008 | McEwen et al. | 360/39 |
| 2004/0032683 | A1 * | 2/2004 | Ashley et al. | 360/46 |
| 2004/0037373 | A1 * | 2/2004 | Ashley et al. | 375/341 |
| 2005/0219727 | A1 * | 10/2005 | Kajiwara et al. | 360/39 |
| 2008/0192378 | A1 * | 8/2008 | Bliss et al. | 360/69 |
| 2011/0075569 | A1 * | 3/2011 | Marrow et al. | 370/242 |

OTHER PUBLICATIONS

Kavcic, Aleksandar et al., "The Viterbi Algorithm and Markov Noise Memory", IEEE Transaction on Information Theory, vol. 46, No. 1, Jan. 2000, pp. 291-301.

Moon, Jaekyun et al., "Pattern-Dependent Noise Prediction in Signal-Dependent Noise", IEEE Journal on Selected Areas in Communications, vol. 19, No. 4, Apr. 2001, pp. 730-743.

* cited by examiner

*Primary Examiner* — John Trimmings
(74) *Attorney, Agent, or Firm* — Westman, Champlin & Kelly, P.A.

(57) ABSTRACT

A Viterbi detector includes a plurality of possible bit patterns that correspond to branches of a detector trellis and a plurality of data dependent noise prediction filters, with multiple filters of different orders being associated with a given bit pattern. A method of decoding includes applying observables to a Viterbi detector that associates a plurality of data dependent noise filters with a given possible bit pattern that corresponds to a branch of the detector trellis, calculating the composite maximum likelihood branch metric by incorporating the results of filtering the observables through the associated plurality of filters, calculating the composite maximum likelihood branch metrics in the same manner for other possible bit patterns, and so forth, and associating soft output values with detected bits in the observables based on the calculated branch metrics.

20 Claims, 4 Drawing Sheets

VITERBI DETECTOR THAT ASSOCIATES MULTIPLE DATA DEPENDENT NOISE PREDICTION FILTERS WITH EACH POSSIBLE BIT PATTERN

BACKGROUND OF THE INVENTION

Background Information

The invention relates generally to Viterbi detectors.

Viterbi detectors are well known and used in systems for detecting and decoding data in signals received over channels, such as, for example, signals read from storage devices. Viterbi detectors are also included in low density parity check (LDPC) decoders, when iterative decoding is utilized. The LDPC decoders typically include Viterbi detectors that produce soft decisions, or output values, which include sign bits and associated multiple bit confidence values for the respective detected bits. The Viterbi detectors that produce the soft outcomes are also referred to as SOVA detectors, because they operate in accordance with a soft output Viterbi algorithm.

A Viterbi detector operates essentially by determining which branches of a trellis are on most likely paths or routes through the trellis. The branches, which in the detectors of interest correspond to multiple bits or symbols, are associated also with maximum likelihood branch metrics that are calculated based on observables in a received signal. The detector determines the most likely route by selecting branches based on the applicable maximum likelihood branch metrics. The Viterbi detectors typically include sub-systems, or branch metric units, that calculate the maximum likelihood branch metrics for the respective branches or corresponding possible bit patterns.

The Viterbi detectors of interest operate using data dependent noise prediction (DDNP) filters. As is known, the bit patterns in the signals received over channels have associated with them both uncorrelated white noise and signal dependent noise, such as intersymbol interference and other channel noise that is correlated with the bit patterns in the signal. The DDNP filters essentially randomize, or whiten, the signal dependent noise, to provide better detection of the respective bit patterns. The use of DDNP filters is discussed in a paper entitled "The Viterbi Algorithm and Markov Noise Memory," by Kavcic and Moura, IEEE Transactions on Information Theory, Vol. 46, No. 1, January 2000, pages 291-301. As discussed in the paper, the branch metrics are calculated based on the assumption that the received signals are at least wide-sense stationary for each possible bit pattern, that is for each pattern, the signal mean is constant over time and the elements of the associated covariance matrix depend only on differences in time. Further, for each bit pattern, the covariance matrix is symmetric positive definite and the maximum likelihood branch metric calculations utilize linear-prediction based DDNP filters of a certain order L, with each branch or bit pattern associated with one DDNP filter. The Viterbi detectors are optimum in a maximum likelihood (ML) sense, however, their performance degrades if the signal doesn't meet the assumptions associated with ML.

SUMMARY OF THE INVENTION

A Viterbi detector includes a plurality of possible bit patterns that correspond to branches of a detector trellis and a plurality of data dependent noise prediction filters, with multiple filters of different orders being associated with a given bit pattern.

A method of decoding includes applying observables of a received signal to a Viterbi detector that associates a plurality of data dependent noise prediction filters of different orders with a given bit pattern that corresponds to a branch of a detector trellis, calculating a composite maximum likelihood branch metric, incorporating the results of filtering the observables associated with the given bit pattern through the associated plurality of filters, repeating the calculating step for other possible bit patterns, and associating soft output values with detected bits in the observables based on the calculated branch metrics.

A system for decoding data includes a receiver for receiving signals that correspond to data bits and producing observables, a Viterbi detector that associates a plurality of data dependent noise prediction filters of different orders with a given possible bit pattern that corresponds to a branch of a detector trellis, the Viterbi detector calculating a composite maximum likelihood branch metric that incorporates the results of filtering the observables associated with the given bit pattern through the associated plurality of filters, repeating the calculating step for other possible bit patterns, and associating soft output values with detected bits in the observables based on the calculated branch metrics.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
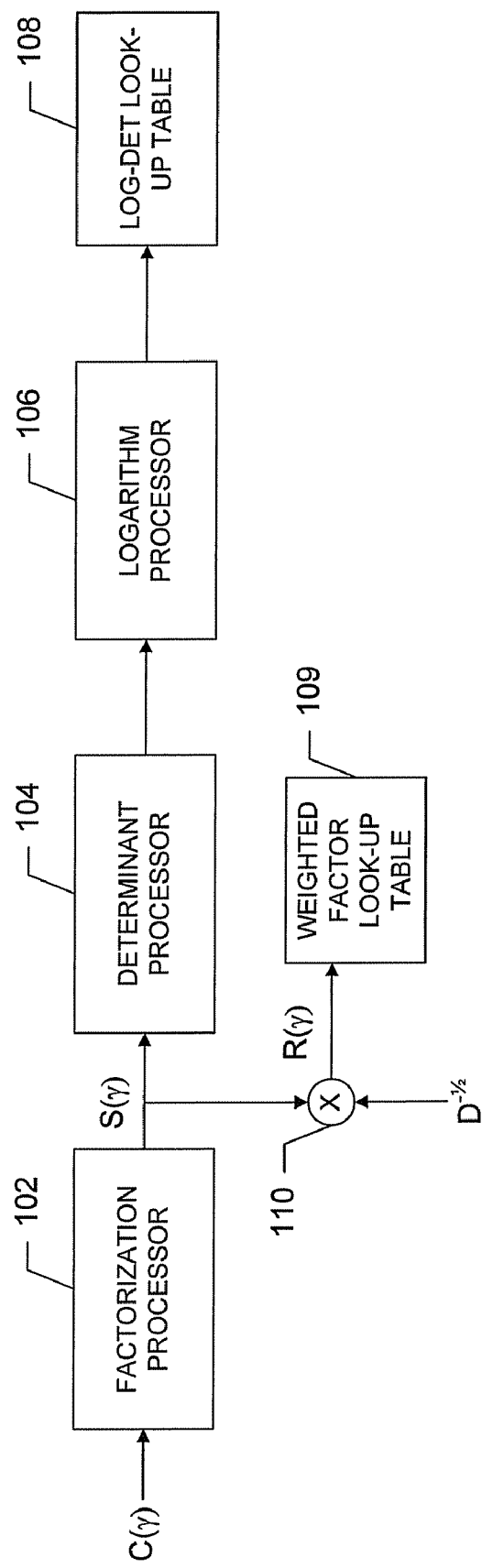
FIG. 1 is a functional block diagram of a training sub-system for use in estimating parameters that are used to calculate the composite maximum likelihood branch metrics.

A Viterbi detector branch metric system discussed below with reference to FIGS. 1-4 operates with covariance matrices that are symmetric positive definite and associates multiple data dependent noise prediction (DDNP) filters of different orders with each branch or possible bit pattern of the Viterbi detector trellis. The system thus operates in a manner that differs fundamentally from the conventional Viterbi detector, which associates a single, highest order, DDNP filter with each branch or possible bit pattern of a Viterbi detector trellis.

The system calculates the inverses of the covariance matrices based on factorization of the covariance matrices, to avoid computatively intense matrix inversion operations. Further, the system utilizes the results of the factorization to calculate the determinants of the covariance matrices. The system performs the factorization and calculates the determinants during system training, and thus avoids having to perform calculations that are both complex and time consuming during detection operations. The branch metrics calculated by the system are referred to herein also as "composite maximum likelihood branch metrics."

The system calculates the composite maximum likelihood branch metric for a bit pattern γ based on the following:

$$\Lambda_{CML}(n_k^{k-L}, \gamma) = \frac{1}{2}\log(\det C(\gamma)) + \frac{1}{2}(n_k^{k-L}(\gamma))^T C^{-1}(\gamma) n_k^{k-L}(\gamma) \quad \text{eqn. 1}$$

where $n_k^{k-L}(\gamma) = [n_{k-L}, n_{k-L+1}, \ldots, n_k]^T$ is the noise or observables vector that is γ-dependent, $C(\gamma)$ is the γ-dependent covariance matrix of dimension $(L+1) \times (L+1)$, "det" denotes matrix determinant, and "T" denotes matrix or vector transpose.

The system utilizes a training sub-system (FIGS. 1 and 2) to pre-calculate values for parameters that are utilized in the determination of the composite maximum likelihood branch metrics and a detection sub-system (FIGS. 3 and 4) that operates in real time to calculate the composite maximum likelihood branch metrics for the observables in a received signal. As discussed in more detail below, for a given pattern γ, the system calculates a composite maximum likelihood branch metric by applying a Cholesky factorization to the covariance matrix:

$$C(\gamma) = S(\gamma) S^T(\gamma)$$

where $S(\gamma)$ is a lower triangular matrix. The inverse of the covariance matrix $C(\gamma)$ can then be calculated from the inverse of the matrix $S(\gamma)$ and its transpose and the composite maximum likelihood branch metric becomes:

$$\Lambda_{CML}(n_k^{k-L}, \gamma) = \frac{1}{2}\log(\det C(\gamma)) + \frac{1}{2}(n_k^{k-L}(\gamma))^T C^{-1}(\gamma) n_k^{k-L}(\gamma) \quad \text{eqn. 2}$$

$$= \frac{1}{2}\log(\det C(\gamma))$$

$$+ \frac{1}{2}(n_k^{k-L}(\gamma))^T S^{-T}(\gamma) S^{-1}(\gamma) n_k^{k-L}(\gamma)$$

$$= \frac{1}{2}\log(\det C(\gamma)) + \frac{1}{2} w^T(\gamma) w(\gamma)$$

where $w(\gamma)$ is a vector of dimension $(L+1)$ that is obtained as the solution of the linear system of equations:

$$S(\gamma) w(\gamma) = n_k^{k-L}(\gamma).$$

Figure 2:
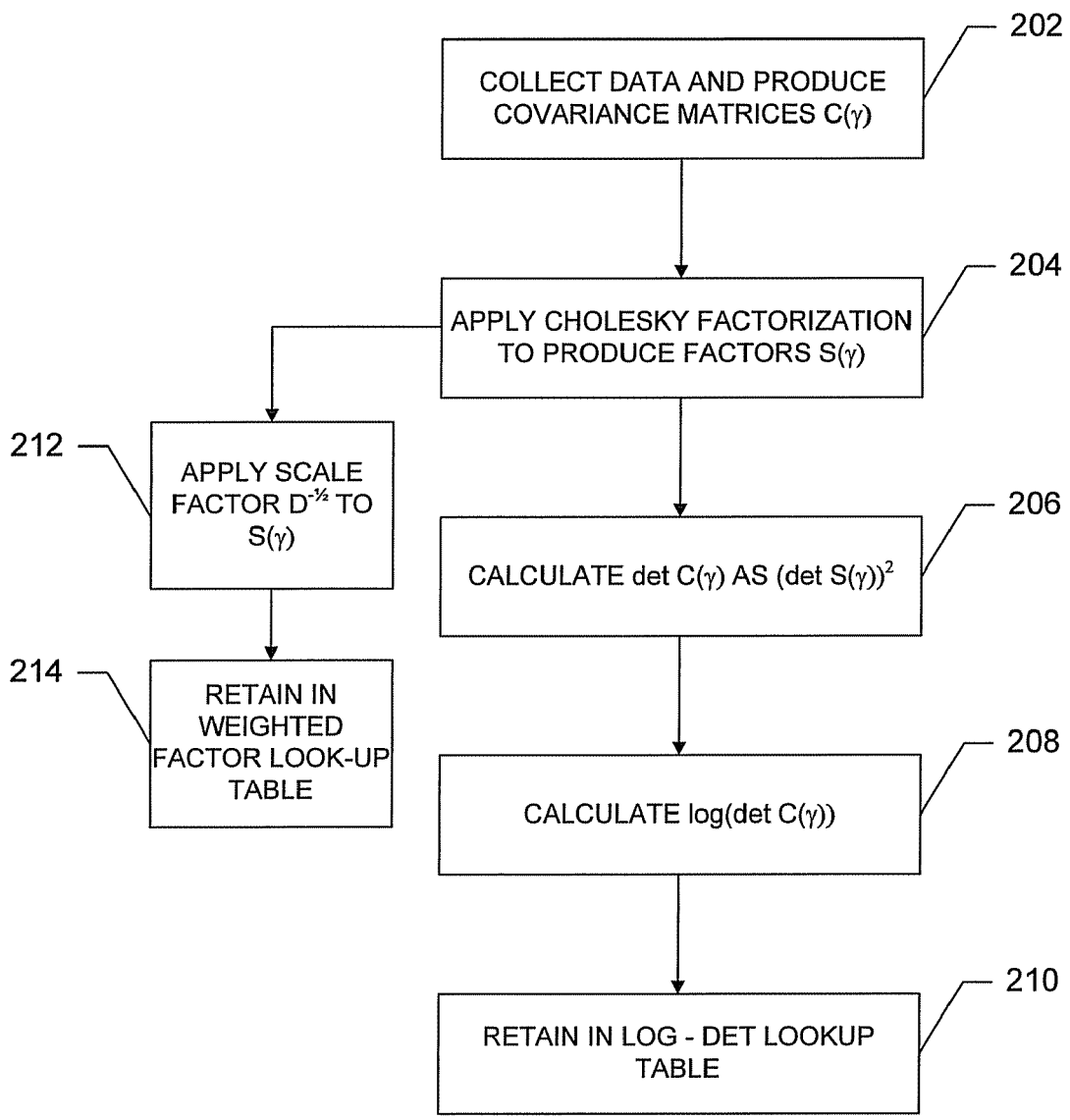
FIG. 2 is a flow chart of the operations of the sub-system of FIG. 1.

Referring to FIGS. 1 and 2, the system collects statistics during a training phase that uses known data. The system determines $(L+1) \times (L+1)$ covariance matrices $C(\gamma)$ for the respective possible bit patterns γ (step 202). As is known in the art, the possible bit patterns are associated with respective branches of the trellis that underlies the operations of the Viterbi detector.

In step 204, a factorization processor 102 applies a Cholesky factorization to the respective covariance matrices $C(\gamma)$, to determine for a given covariance matrix a factorization matrix $S(\gamma)$ for which $C(\gamma) = S(\gamma) S^T(\gamma)$.

A determinant processor 104 then calculates the determinant of the covariance matrix $C(\gamma)$ as:

$$\det(C(\gamma)) = \det(S(\gamma)) \det(S^T(\gamma))$$

and since $\det(S(\gamma)) = \det(S^T(\gamma))$ for the lower triangular matrix $S(\gamma)$, the processor in step 206 calculates the determinant of the matrix $S(\gamma)$ as a product of its diagonal elements and squares the result:

$$\det(C(\gamma)) = [\det(S(\gamma))]^2$$

$$= \left(\prod_{i=0}^{L} s_{ii}(\gamma)\right)^2.$$

A logarithm processor 106 in step 208 calculates $\log(\det C(\gamma))$ in a known manner and, in step 210, the result is stored in a log-det look-up table 108, which is addressable by the bit patterns γ.

The factorization matrix $S(\gamma)$ is also provided to a multiplier 108, which in step 212 scales the result by weighting the respective elements of the factorization matrix $S(\gamma)$. The matrix $S(\gamma)$ is thus multiplied by a scaling factor $D^{-1/2}$:

$$R(\gamma) = S(\gamma) D^{-1/2}$$

where:

$$D = \frac{1}{(L+1)} \begin{pmatrix} 1 & 0 & \cdots & 0 & 0 \\ 0 & 2 & 0 & \cdots & 0 \\ \vdots & \ddots & \ddots & \ddots & \vdots \\ 0 & \cdots & 0 & L & 0 \\ 0 & \cdots & \cdots & 0 & L+1 \end{pmatrix}$$

By including the scaling factor in the factorization matrix, the system performs in fewer steps the calculations in which the respective elements of the vector $w(\gamma)$ are properly scaled or weighted with respect to one another. For example, the ith element of $w(\gamma)$ is scaled by a factor $$\sqrt{\frac{(i+1)}{(L+1)}}.$$

In step 214, the matrix $R(\gamma)$ is retained in weighted factor look-up table 109, which is also addressable by the bit patterns γ.

To bring the composite maximum likelihood branch metric calculated during the detection phase into the same range as a maximum likelihood branch metric calculated in the conventional manner, the system divides the results by $$\frac{(L+2)}{2},$$

which is the sum of the scaling factors used for the product $w^T(\gamma) w(\gamma)$ in eqn. 2, namely:

$$\frac{1}{(L+1)} \sum_{i=0}^{L} (i+1) = \frac{(L+1)(L+2)}{2(L+1)}$$

$$= \frac{(L+2)}{2}$$

The system thus calculates the composite maximum likelihood branch metric as:

$$\Lambda_{CML}(n_k^{k-L}, \gamma) = \frac{1}{(L+2)}\left(\log(\det C(\gamma)) + \frac{1}{(L+1)}\sum_{i=0}^{L}(i+1)w_i^2(\gamma)\right) \quad \text{eqn. 3}$$

The components of the second term of the right hand side of this equation, namely, the $w_i(\gamma)$'s, indicate the filtering of the observables through the multiple DDNP filters of different orders for a given pattern, and thus, the whitening of the data dependent noise.

The composite maximum likelihood branch metrics, which are in the same range as conventional maximum likelihood branch metrics, can be used in a known manner to assign soft output values to detected bits and, as appropriate, decode bit values directly. Alternatively, the soft output values may be provided to known LDPC decoders (not shown), or other conventional decoders, such as, for example, MAP decoders (not shown) that operate iteratively with soft output Viterbi detectors.

The system may instead calculate the composite maximum likelihood branch metric as:

$$\Lambda_{CML}(n_k^{k-L}, \gamma) = \frac{1}{2}\sum_{i=0}^{L}\left(\log(\sigma_i^2(\gamma)) + \frac{([-b_i^T(\gamma)\ 1]n_{k-L+i}^{k-L}(\gamma))^2}{\sigma_i^2(\gamma)}\right) \quad \text{eqn. 4}$$

where $-b_i^T(\gamma)$ for $i=0, 1 \ldots L$ are the tap vectors for the respective L+1 DDNP filters and $\sigma_i^2(\gamma)$ are the associated error variances. This expression the equivalent to eqn. 1 which can be seen by considering the contributions to the branch metric of the noise components or observables filtered through the various pluralities of DDNP filters, as set forth below. However, the use of factorization described above to implement eqn. 1 results in a less complex training sub-system.

Consider eqn. 1 and the contributions of the respective noise components:

$$\Lambda_{CML}(n_k^{k-L}, \gamma) = \frac{1}{2}\log(\det C_L(\gamma)) + \frac{1}{2}(n_k^{k-L}(\gamma))^T C_L^{-1}(\gamma)n_k^{k-L}(\gamma)$$

$$= \frac{1}{2}\log(\det C_L(\gamma)) + \frac{1}{2}(n_k^{k-L}(\gamma))^T C_L^{-1}(\gamma)n_k^{k-L}(\gamma) -$$

$$\frac{1}{2}\log(\det C_{L-1}(\gamma)) - \frac{1}{2}(n_{k-1}^{k-L}(\gamma))^T C_{L-1}^{-1}(\gamma)n_{k-1}^{k-L}(\gamma) +$$

$$\frac{1}{2}\log(\det C_{L-1}(\gamma)) + \frac{1}{2}(n_{k-1}^{k-L}(\gamma))^T C_{L-1}^{-1}(\gamma)n_{k-1}^{k-L}(\gamma)$$

$$\vdots$$

$$-\frac{1}{2}\log(\det C_0(\gamma)) + \frac{1}{2}(n_{k-L}^{k-L}(\gamma))^T C_0^{-1}(\gamma)n_{k-L}^{k-L}(\gamma) +$$

$$\frac{1}{2}\log(\det C_0(\gamma)) + \frac{1}{2}(n_{k-L}^{k-L}(\gamma))^T C_0^{-1}(\gamma)n_{k-L}^{k-L}(\gamma)$$

where the matrices $C_i(\gamma)$, $i=0, 1, \ldots, L-1$, are the upper $(i+1)\times(i+1)$ principal minors of the $(L+1)\times(L+1)$ covariance matrix $C_L$.

For each pair of filtered noise components, the associated contribution to the composite maximum likelihood branch metric is:

$$P_i = \frac{1}{2}\log(\det C_i(\gamma)) + \frac{1}{2}(n_{k-L+i}^{k-L}(\gamma))^T C_i^{-1}(\gamma)n_{k-L+i}^{k-L}(\gamma) -$$

$$\frac{1}{2}\log(\det C_{i-1}(\gamma)) - \frac{1}{2}(n_{k-L+i-1}^{k-L}(\gamma))^T C_{i-1}^{-1}(\gamma)n_{k-L+i-1}^{k-L}(\gamma),$$

$$i = 0, 1, \ldots, L.$$

which can be written as a linear-predictor-based expression of the form:

$$P_i = \frac{1}{2}\left(\log(\sigma_i^2(\gamma)) + \frac{([-b_i^T(\gamma)\ 1]n_{k-L+i}^{k-L}(\gamma))^2}{\sigma_i^2(\gamma)}\right), i = 0, 1, \ldots, L$$

and summing $P_i$ over $i=0, 1 \ldots L$ produces eqn. 4, which includes the contributions of the noise or observable vector filtered through all of the DDNP filters (of orders $0, 1, \ldots, L$) corresponding to the given pattern $\gamma$.

Alternatively, the system may utilize selected sub-sets of the multiple filters by utilizing the DDNP filter with the highest order L and one or more consecutive lower order DDNP filters, e.g., L–1, L–2 and so forth. The eqns. 3 or 4 may be modified accordingly by summing over the associated values of i.

Figure 3:
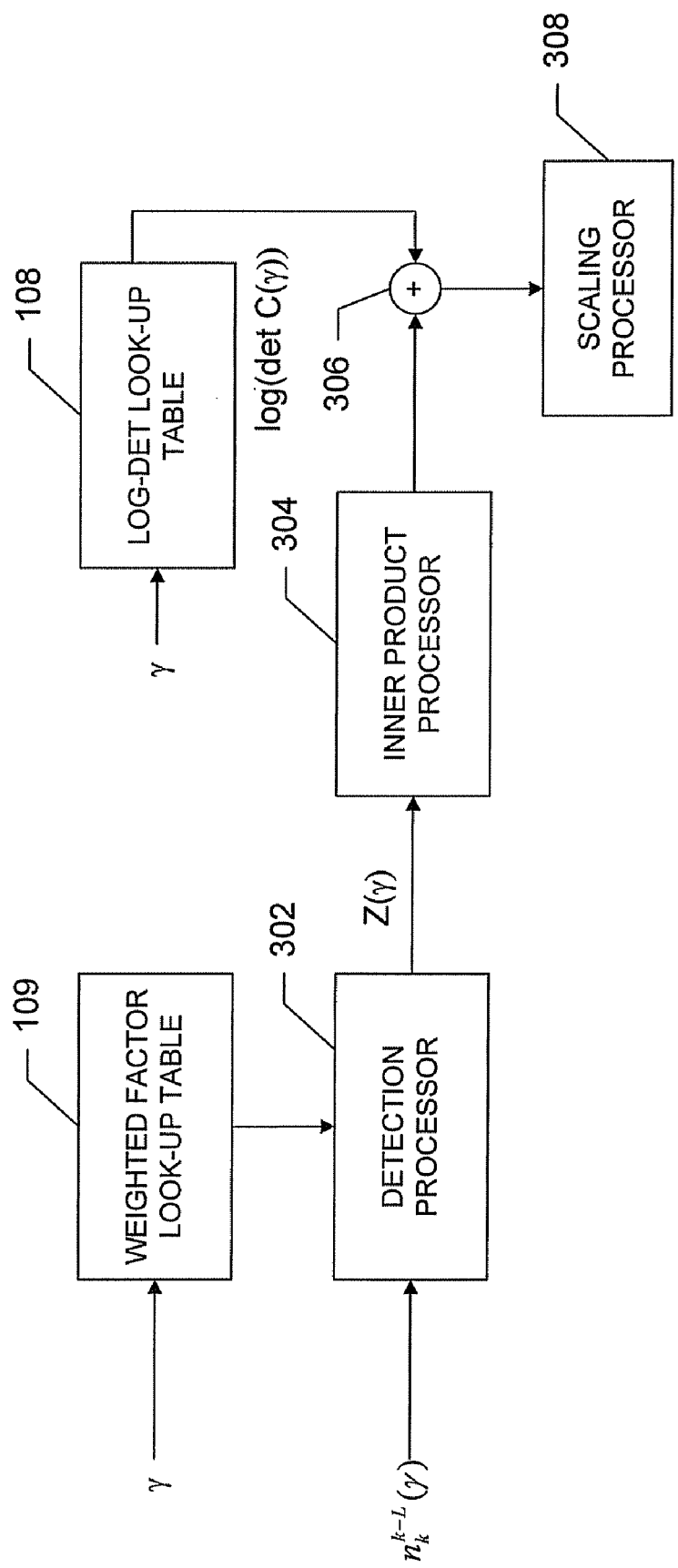
FIG. 3 is a functional block diagram of a detection sub-system that calculates the composite maximum likelihood branch metrics using the parameters estimated by the sub-system of FIG. 1.
Figure 4:
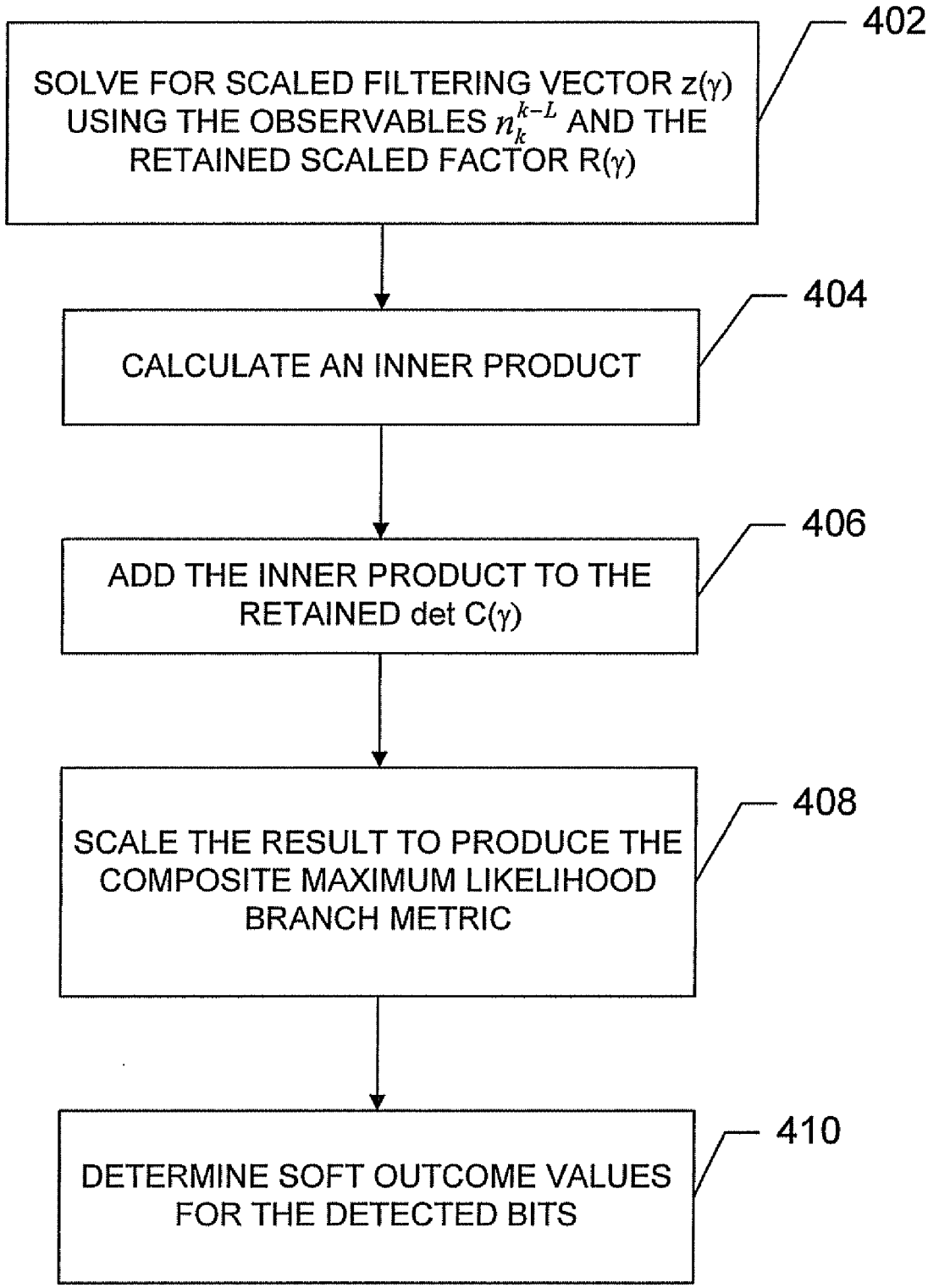
FIG. 4 is a flow chart of the operations of the sub-system of FIG. 3.

With reference to FIGS. 3 and 4, the detection phase or sub-system utilizes the parameters that were estimated and retained during the training phase, namely, the $\log(\det C(\gamma))$ from the log-det look-up table 108 and the scaled factorization matrix $R(\gamma)$, which may be retained in the same or one or more other look-up tables. In the example, the matrix $R(\gamma)$ is retained in a lookup table 109 that, like the table 108, is addressable by the bit patterns $\gamma$. Since $R(\gamma)$ is a triangular matrix, only the non-zero values need be stored.

To calculate the composite maximum likelihood branch metric for a given trellis branch or bit pattern $\gamma$, the noise or observables vector and the associated matrix $R(\gamma)$, which is retrieved from the look-up table 109 and, as appropriate, re-constructed with zeros, are applied to a detection processor 302 that, in step 402, solves a linear system of equations to produce a scaled filtering vector $z(\gamma)$:

$$R(\gamma)z(\gamma) = n_k^{k-L}(\gamma) \Leftrightarrow$$

$$z(\gamma) = R^{-1}(\gamma)n_k^{k-L}(\gamma)$$

$$z(\gamma) = D^{1/2}S^{-1}(\gamma)n_k^{k-L}(\gamma)$$

$$z(\gamma) = D^{1/2}w(\gamma)$$

An inner product processor 304 in step 404 calculates $z^T(\gamma)z(\gamma)$ as:

$$\sum_{i=0}^{L}z_i^2(\gamma) = \frac{1}{(L+1)}\sum_{i=0}^{L}(i+1)w_i^2(\gamma)$$

An adder 306, in step 406, adds the result with the associated $\log(\det C(\gamma))$ value, which is retrieved from the log-det look-up table 108 using the bit pattern $\gamma$. Next, in step 408 a scaling processor 308 multiplies the sum by $$\frac{1}{L+2}$$

to produce the composite maximum likelihood branch metric, which is scaled to the range of branch metrics calculated in a conventional manner. The system then utilizes the composite maximum likelihood branch metric in a known manner in step 410 to assign soft output values to detected bits. The soft output values can then be utilized in a known manner to decode the bits directly. Alternatively, the soft output values may be provided to a conventional LDPC, MAP or other iterative decoder, which operates in a known manner to decode the bits. If the soft output values are to be used directly to decode the bits, the scaling step 408 and/or processor 308 may be omitted.

The foregoing description has been limited to a specific embodiment of this invention. It will be apparent, however, that variations and modifications may be made to the invention, such as one or more processors may be combined or a single processor may be incorporated into multiple processors, other scaling factors may be utilized or one or more scaling factors may be eliminated, other mechanisms may be incorporated to calculate the determinant and/or the inverse of the covariance matrices and/or all L+1 DDNP filters or multiple filter sub-sets thereof may be used, with the attainment of some or all of its advantages. Therefore, it is the object of the appended claims to cover all such variations and modifications as come within the true spirit and scope of the invention.

What is claimed is:

1. A Viterbi detector including:
    a plurality of possible bit patterns that correspond to branches of a detector trellis; and
    a plurality of data dependent noise prediction filters, with multiple filters of different orders being associated with a given bit pattern, and the multiple filters including lower order filters.

2. The detector of claim 1 wherein the multiple data dependent noise prediction filters includes a highest order filter and at least a next lower order filter.

3. The detector of claim 2 wherein the multiple data dependent noise prediction filters includes all lower order filters.

4. The detector of claim 3 wherein the respective filters are associated with prediction error variances.

5. The detector of claim 4 wherein the possible bit patterns are further associated with composite maximum likelihood branch metrics that are each calculated by incorporating the results of filtering observables through the associated multiple filters.

6. The detector of claim 5 further calculating a composite maximum likelihood branch metric for a given possible bit pattern as:

$$\Lambda_{CML}(n_k^{k-L}, \gamma) = \frac{1}{2}\log(\det C(\gamma)) + \frac{1}{2}(n_k^{k-L}(\gamma))^T C^{-1}(\gamma) n_k^{k-L}(\gamma)$$

where Y is the possible bit pattern, C(Y) is a Y-dependent covariance matrix and $n_k^{k-L}$(Y) is a Y-dependent noise or observables vector.

7. The detector of claim 6 further including a determinant processor that produces a determinant of a covariance matrix associated with a given bit pattern by determining a Cholesky factor and squaring the factor.

8. The detector of claim 7 further including a look-up table addressable by the bit patterns for storing the determinants of the covariance matrices.

9. The detector of claim 7 further including one or more processors for determining an inverse of the covariance matrix using an inverse of the Cholesky factor.

10. The detector of claim 5 further calculating a composite maximum likelihood branch metric for a given pattern as:

$$\Lambda_{CML}(n_k^{k-L}, \gamma) = \frac{1}{2}\sum_{i=0}^{L}\left[\log(\sigma_i^2(\gamma)) + \frac{([-b_i^T(\gamma)\ 1]n_{k-L+i}^{k-L}(\gamma))^2}{\sigma_i^2(\gamma)}\right]$$

where $-b_i^T$(Y) for i=0, 1 ... L are tap vectors for the respective L+1 DDNP filters corresponding to bit pattern Y and $\sigma_i^2$(Y) are the associated error variances.

11. A method of detecting bits including
    applying observables of a received signal to a Viterbi detector that associates a plurality of data dependent noise prediction filters of different orders with a given possible bit pattern that corresponds to a branch of a detector trellis, the plurality of data dependent noise prediction filters being associated with prediction error variances;
    calculating a composite maximum likelihood branch metric incorporating the results of filtering the observables through the associated plurality of filters;
    repeating the calculating step for other possible bit patterns; and
    associating soft output values with detected bits in the received signal based on the calculated branch metrics.

12. The method of claim 11 further including the step of assigning data values to the detected bits based on the associated soft output values.

13. The method of claim 11 wherein the plurality of data dependent noise prediction filters includes a highest order filter and at least one lower order filter.

14. A method of detecting bits including
    applying observables of a received signal to a Viterbi detector that associates a plurality of data dependent noise prediction filters of different orders with a given possible bit pattern that corresponds to a branch of a detector trellis, the plurality of data dependent noise prediction filters includes all of the including lower order filters;
    calculating a composite maximum likelihood branch metric incorporating the results of filtering the observables through the associated plurality of filters;
    repeating the calculating step for other possible bit patterns; and
    associating soft output values with detected bits in the received signal based on the calculated branch metrics.

15. The method of claim 14 wherein the plurality of data dependent noise prediction filters are associated with prediction error variances.

16. The method of claim 14 wherein the plurality of data dependent noise prediction filters include all lower order filters.

17. The method of claim 14 further including the step of assigning data values to the detected bits based on the associated soft output values.

18. The method of claim 14 wherein the plurality of data dependent noise prediction filters includes a highest order filter and at least one lower order filter.

19. The method of claim 14 wherein the decoder is a MAP decoder.

20. The method of claim 14 wherein the decoder is a LDPC decoder.

* * * * *